(12) United States Patent
Belot et al.

(10) Patent No.: US 7,382,174 B2
(45) Date of Patent: Jun. 3, 2008

(54) A-AB TRANSCONDUCTOR

(75) Inventors: Didier Belot, Rives (FR); Pascal Persechini, Zillisheim (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 11/649,341

(22) Filed: Jan. 3, 2007

(65) Prior Publication Data
US 2007/0188215 A1 Aug. 16, 2007

Related U.S. Application Data

(63) Continuation of application No. 10/483,463, filed on Apr. 6, 2005, now abandoned.

(51) Int. Cl.
*H03G 3/10* (2006.01)
*G06G 7/24* (2006.01)

(52) U.S. Cl. .................................. 327/346; 330/268

(58) Field of Classification Search ........ 327/560–563, 327/346; 330/290–295, 285
See application file for complete search history.

(56) References Cited

U.S. PATENT DOCUMENTS

| | | | |
|---|---|---|---|
| 3,896,393 A * | 7/1975 | Cave et al. ................. | 330/268 |
| 5,486,787 A | 1/1996 | Maekawa et al. | |
| 5,633,610 A | 5/1997 | Maekawa et al. | |
| 6,339,361 B1 | 1/2002 | Khesbak et al. | |
| 2001/0048347 A1 | 12/2001 | Forstner et al. | |

OTHER PUBLICATIONS

International Search Report from corresponding International Application No. PCT/FR03/00473, filed Feb. 14, 2003.
Patent Abstracts of Japan, vol. 2002, No. 06, Jun. 4, 2002 & JP 2002 050933.

* cited by examiner

*Primary Examiner*—Dinh T. Le
(74) *Attorney, Agent, or Firm*—Lisa K. Jorgenson; James H. Morris; Wolf, Greenfield & Sacks, P.C.

(57) ABSTRACT

A transconductor including circuitry for automatically selecting a non-linear class A operation or a linear class AB operation based on an input signal to be processed to generate an output signal, and for automatically adjusting current from a power supply to a level needed for operation of the transconductor.

10 Claims, 2 Drawing Sheets

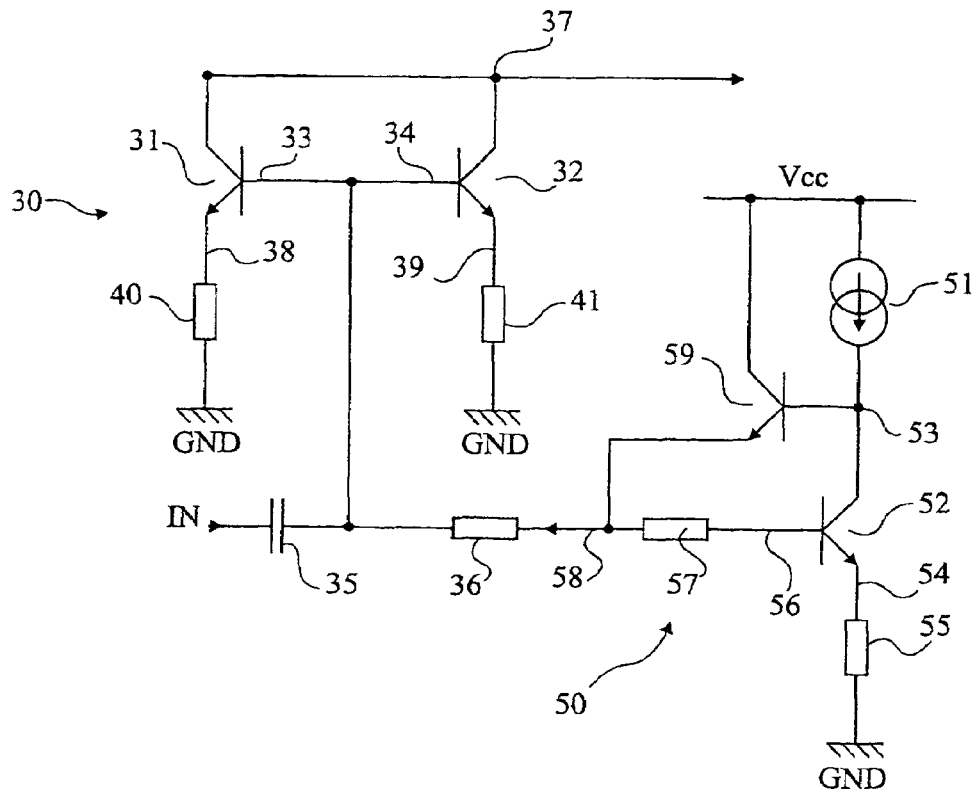
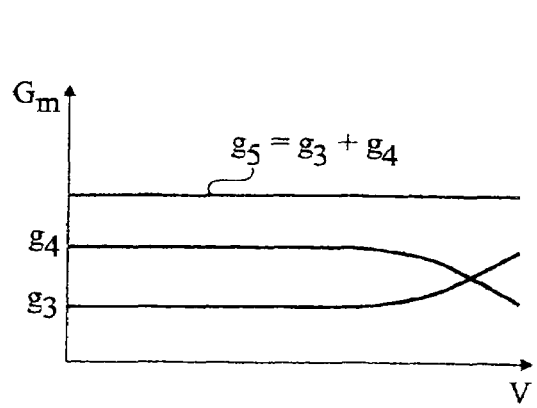
Fig 3B
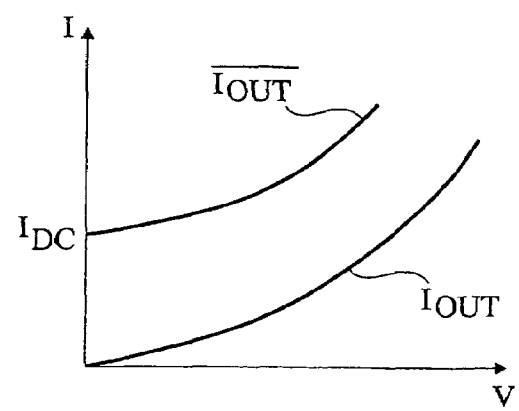
Fig 3C
Fig 3A

A-AB TRANSCONDUCTOR

CROSS REFERENCE TO RELATED APPLICATIONS

This application is a continuation of prior application Ser. No. 10/483,463, filed Apr. 6, 2005 now abandoned, entitled A-AB TRANSCONDUCTOR, which is incorporated herein by reference.

BACKGROUND OF THE INVENTION

1. Field of the Invention

The present invention generally relates to the field of transconductors. More specifically, the present invention relates to transconductors likely to be used in multimode devices, that is, capable of processing signals having different frequency characteristics.

So-called class A non-linear transconductors and so-called class AB transconductors are more specifically considered in the present description.

2. Discussion of the Related Art

Class A or class AB transconductors are used to perform many functions such as, in particular, amplifications or signal mixings. For example, transconductors are used in chains of transmission or reception of signals to implement, in particular, so-called low-noise receive amplifiers (LNA), so-called power transmission amplifiers (PA) or mixers.

The type—class A or class AB—of the transconductor used to implement such function depends on the application. Consider for example the case of transmission chains in the field of radiotelephony or mobile telephony. In this field, there exist different standards especially characterized by different frequency ranges, among which standards UMTS or WCDMA, of a frequency on the order of 2.16 Hz, standard GSM of a frequency of 900 MHz, or standard DCS of a frequency of 1.8 GHz.

FIG. 1A schematically illustrates the structure of a transconductor 1. Such a transconductor 1 includes an NPN-type bipolar transistor 2. Base 3 of transistor 2 forms a first input/output terminal of the transconductor. Base 3 receives an input signal IN, for example, in mobile telephony, a radiofrequency signal. Emitter 4 of transistor 2 is connected to a low-voltage reference line or ground GND, via a series connection of an impedance 5 and of a constant D.C. current source 6. Collector 7 of transistor 2 forms a second input/output terminal of the transconductor and provides output signal OUT of transconductor 1. Collector 7 is connected to any device, illustrated by an input/output terminal 8, providing a signal to be mixed with input signal IN. For example, device 8 provides a signal enabling switching input signal IN, or a carrier signal to be modulated by input signal IN. Device 8 is not necessarily unique. It may be an intermediary stage of a mixer of several signals, for acquiring one of the signals to be mixed.

FIGS. 1B and 1C respectively illustrate characteristics of transconductance gain G and of current I as a function of the level of voltage input V in the transconductor of FIG. 1A. Transconductance gain G, which is proportional to the value of the bias current of transistor 2, is a constant $g_0$ for low levels of base-emitter voltage V across transistor 2. Beyond a given threshold $V_0$, gain G decreases. Short of threshold $V_0$, the dynamic output current $I_{OUT}$ then is, as illustrated in FIG. 1C, proportional to base-emitter voltage V and limited by value $I_{DC}$ of D.C. current source 6. Beyond threshold $V_0$, the behavior of the class A transconductor is poorly defined. The input signals are thus limited to those for which the input voltage is smaller than $V_0$.

FIG. 2A schematically illustrates the structure of a class AB transconductor 20. FIGS. 2B and 2C, which are homologous to FIGS. 1B and 1C, illustrate the gain and current characteristics according to the input voltage of transconductor 20.

Transconductor 20 includes an NPN-type bipolar transistor 21, base 22 of which forms a first input/output terminal, receiving a signal IN, for example, a radiofrequency signal, collector 23 of which forms an output terminal of a current OUT and emitter 24 of which is degenerated, that is, connected to a reference supply GND by an impedance 25. Further, base 22 is connected to a current bias source 26 by a resistor 27. As previously for class A transconductor 1 of FIG. 1A, collector 23 may be connected to an input device 28 of a signal to be mixed or of an amplification order or of a carrier signal or other.

Transconductor 20 exhibits an exponential characteristic of gain G according to input base-emitter voltage V, illustrated in FIG. 2B. This enables, as illustrated in FIG. 2C, obtaining a static component (or mean current) $\overline{I_{OUT}}$ of the output signal current which varies as a function of the input signal. The dynamic component of output signal current $I_{out}$ is then no longer limited by the bias signal, but follows, or even exceeds, the mean current.

In the example of application to telephony, to enable a user to keep a given device when a standard changes, one mixer per frequency range must be provided for each function. Such a solution goes against the miniaturization of portable devices.

It could then be devised to use class A mixers formed of transconductors similar to transconductor 1 of FIG. 1A, which would be forced to have a linear component by imposing a constant current (source 6) sufficiently high for transistor 2 to operate in linear state. Such a solution would have many disadvantages. In particular, such mixers would have a relatively poor linearity as compared to class AB mixers formed of class AB transconductors. Further, this would be obtained at the expense of high power consumption. Such a power consumption would then also exist for small signals although it is not necessary. This would be particularly disadvantageous due to the large number of transconductors used in a multimode transceiver device. The required power supplies would then become bulky and impose at best frequent recharges, which is incompatible with the mobile character of the device. Further, the high power consumption, useless in the case of small signals, would impose additional dissipation constraints in the form of thermal power.

SUMMARY OF THE INVENTION

The present invention aims at providing a multimode transconductor.

The present invention aims at providing such a transconductor which behaves, according to the input signal level, as a class A or as a class AB transconductor.

The present invention aims at providing such a transconductor which automatically adjusts its consumption level to the level necessary to its operation.

To achieve these and other objects, the present invention provides a transconductor including means for automatically selecting a non-linear class A operation or a linear class AB operation based on an input signal to be processed, and for automatically adjusting the current sampled from a power supply to a level necessary to its operation.

According to an embodiment of the present invention, the transconductor includes at least two bipolar transistors, the common bases of which define a first input/output terminal of the transconductor;

the interconnected collectors of which define a second input/output terminal of the transconductor;

the emitters of which are individually connected to a low voltage reference line by a respective impedance; and the bases of which are connected to a same D.C. current source.

According to an embodiment of the present invention, the impedances of each individual connection of the emitters of the two bipolar transistors to the low voltage reference line (GND) are just resistive.

According to an embodiment of the present invention, the bases are connected to the D.C. current source by an isolating resistor.

According to an embodiment of the present invention, the ratios of the isolating resistance to the resistance of the individual connection of the emitters to the reference line are different.

According to an embodiment of the present invention, the two bipolar transistors are of different sizes, and the impedance of the individual resistive connection of each of their emitters to the voltage reference line is implemented by a respective resistor.

According to an embodiment of the present invention, the D.C. current source is formed by the connection, between a high supply line and the low voltage reference line, of a D.C. current source, of a first bipolar transistor of a given type, the junction of the current source and of the first transistor being connected to the base of a second bipolar transistor of the same type as the first transistor, a collector/emitter terminal of which is connected to the high supply line and an emitter/collector terminal of which is connected to the base of the first transistor and forms the current source output.

According to an embodiment of the present invention, a resistor is interposed between the base of the first bipolar transistor and the emitter/collector terminal of the second bipolar transistor forming the output of the D.C. current source.

The present invention also provides an input/output stage of a mixer or of a power amplifier or of a low-noise amplifier, formed of a transconductor according to any of the preceding embodiments.

The foregoing objects, features and advantages of the present invention will be discussed in detail in the following non-limiting description of specific embodiments in connection with the accompanying drawings, in which:

BRIEF DESCRIPTION OF THE DRAWINGS

FIG. 3A schematically shows the structure of a transconductor according to the present invention;

FIG. 3B illustrates a characteristic of the gain versus an input voltage of the transconductor of FIG. 3A; and FIG. 3C illustrates a characteristic of the output current versus the input voltage of the transconductor of FIG. 3A.

DETAILED DESCRIPTION

Figure 1A:
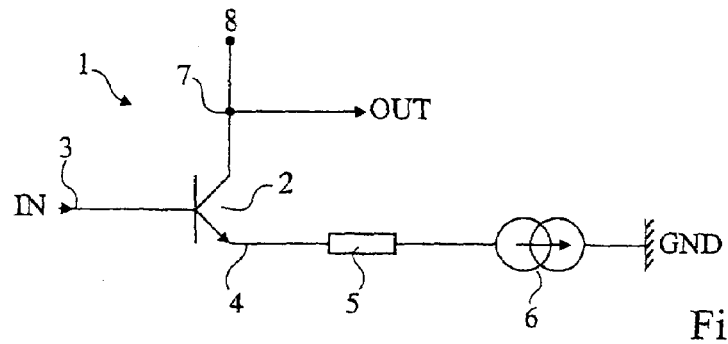
FIG. 1A, previously described, shows the circuit diagram of a conventional class A transconductor.

Only those elements necessary to the understanding of the present invention have been shown and will be described hereafter. In particular, the upstream and downstream circuits of a transconductor according to the present invention have not been detailed. The invention applies whatever the input and output signals. Further, the same elements have been designated with the same references in the different drawings. Moreover, the characteristics of FIGS. 1B, 1C, 2B, 2C, 3B and 3C are not drawn to scale.

FIG. 3A schematically shows the structure of a class AB transconductor 30 according to the present invention.

Transconductor 30 includes at least two bipolar transistors 31, 32 of the same type, for example, NPN. Bases 33 and 34 of transistors 31 and 32 are interconnected at a common point. Common base 33-34 forms an input/output terminal to receive, for example, an input signal IN. An input signal IN of radiofrequency type is decoupled by a capacitor 35. Common base 33-34 is further connected to a D.C. current source 50 by an isolation resistor 36. The collectors of transistors 31 and 32 are interconnected and form an output/input terminal 37. Emitters 38 and 39 of transistors 31 and 32 are individually connected to a voltage reference line GND by a respective resistive connection. The resistance of the connection is shown in FIG. 3A by interposing a resistor 40, 41 between reference line GND and emitter 38, 39 of transistor 31, 32, respectively.

FIG. 3A illustrates a possible embodiment of D.C. current source 50. Source 50 includes, interposed in series between a high voltage supply line Vcc and reference line GND, a current source 51 (for example, a MOS transistor based circuit) and an NPN-type bipolar transistor 52. Transistor 52 is connected to source 51 by its collector 53 and to reference line GND by its emitter 54. A resistor 55 is interposed between emitter 54 and reference GND. The base of transistor 52 is connected to a first terminal 56 of an isolating resistor 57. A second terminal 58 of isolating resistor 57 is connected to bases 33, 34 by the respective isolating resistor 36. Source 50 further includes an NPN-type transistor 59, the base of which is connected to collector 53, and thus also to source 51, the emitter of which is connected to second terminal 58 of isolating resistor 57 and the collector of which is connected to high power supply Vcc.

The values of the different isolating resistors 36 of resistive connections 40 and 41 are chosen according to the following constraints.

Isolating resistor 36 should have a value sufficiently high to guarantee the isolation of D.C. current source 50 against the variations of input signal IN. Indeed, if isolating resistance 36 is too small, the possible noise from source 50 will reach common base 33-34. Isolating resistance 36 should however be sufficiently small to enable passing of the D.C. current necessary to the biasing of transistors 31 and 32.

The choice of resistances 40 and 41 of the resistive connections is performed according to the choice of the value of isolating resistance 36 as follows. On the one hand, the two transistors 31 and 32 should exhibit different transconductances, that is, different products of the bias current by the degenerescence resistance. The determination of the transconductance values to be used is performed, for example, by so-called Volterra developments.

According to an embodiment of the present invention, all transistors are identical.

Figure 1B:
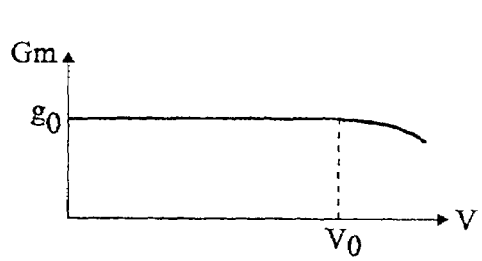
FIGS. 1B and 1C, previously described, illustrate characteristics of the transconductor of FIG. 1A.
Figure 1C:
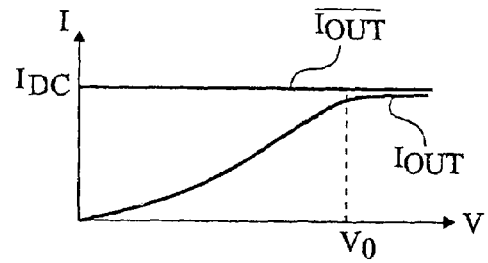
Figure 2A:
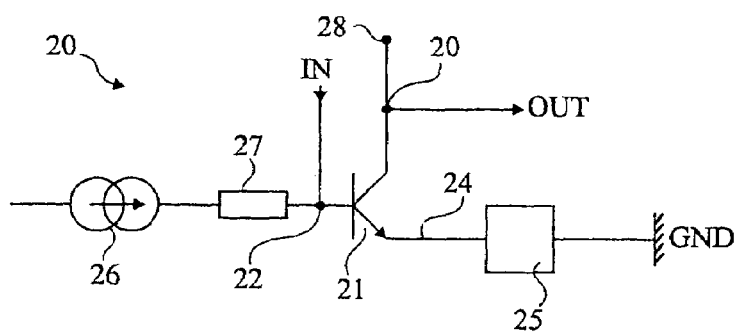
FIG. 2A, previously described, shows the circuit diagram of a conventional class AB transconductor.
Figure 2B:
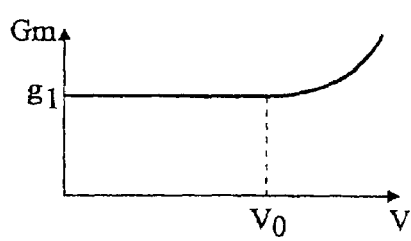
FIGS. 2B and 2C, previously described, illustrate characteristics of the transconductor of FIG. 2A.
Figure 2C:
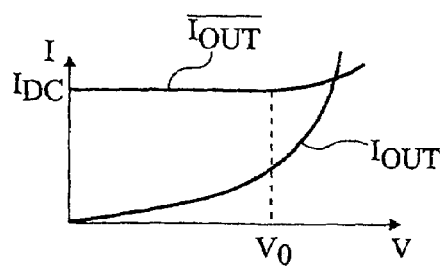

The behavior of transconductor 30 will be described hereafter in relation with FIGS. 3B and 3C. FIG. 3B, which is to be compared with FIGS. 1B and 2B, illustrates gain G of the stage according to input/output voltage V. FIG. 3C, which is to be compared with FIGS. 1C and 2C, illustrates the variations of the transconductor output current $I_{OUT}$ according to the same input voltage V. The considered input voltage V is the base-emitter voltage applied across the transistors in parallel 31 and 32. The gain of the transconductor remains constant at a value $g_5$. However, each transistor 31, 32 has a specific gain $g_3$, $g_4$, characteristic of a class AB stage. Especially, beyond a given threshold $V_0$, each gain $g_3$, $g_4$ varies. A multiple-transconductance implementation according to the present invention enables obtaining inverse variations and same amplitudes. For example, gain $g_3$ tends to increase from threshold $V_0$ while gain $g_4$ tends to decrease.

For small input signals, the transconductor then exhibits a class A behavior. The static output current signal $\overline{I_{OUT}}$ remains constant without taking the input signal variations into account. Beyond a given input power, the transconductor adopts a class AB behavior, whatever the input power, that is, voltage V. Output signal $I_{OUT}$ varies exponentially according to the input signal. In parallel, the level of the current (not shown) sampled by source 50 from supply GND-Vcc remains constant at a minimum value $I_{DC}$, whether the transconductor operates in class A or in class AB. Static current $\overline{I_{OUT}}$ of the transconductor, the minimum value of which is set by bias source 50, varies exponentially according to the input signal from as soon as the transconductor switches to the AB operating mode.

The present invention thus advantageously provides a transconductor likely to automatically switch from a class A operation to a class AB operation and conversely according to the input signal.

Such a stage is thus advantageously usable as an input stage of a mixer or of a low-noise or power amplifier, whatever the standard of the input signal. A single input stage can then be used in multimode applications. It is no longer necessary to manufacture stages specifically dedicated to an operating mode, that is, to provide as many specific manufacturing lines as there are modes.

Further, the power consumption is advantageously automatically adjusted and limited to the needs of the transconductor according to the operating mode.

Further, in a class AB operation, the multimode transconductor according to the present invention advantageously exhibits a linearity greater than known class AB transconductors. Indeed, the connection of multiple transconductances enables obtaining smaller intermodulation products than known class AB transconductors.

Of course, the present invention is likely to have various alterations, modifications, and improvements which will readily occur to those skilled in the art. In particular, the present invention has been described in the case of an equivalent transconductor including two distinct transconductances. However, it is possible to increase the number of transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A transconductor for automatically selecting a non-linear class A operation or a linear class AB operation based on in response to a value of an input signal to be processed to generate an output signal, and for automatically adjusting current from a power supply to a level needed for operation of the transconductor, the transconductor comprising:
   at least two bipolar transistors, common bases of which define a first input/output terminal of the transconductor;
   interconnected collectors of the at least two bipolar transistors which define a second input/output terminal of the transconductor;
   emitters of the at least two bipolar transistors, each of the emitters is individually connected to a low voltage reference line by a respective impedance; and
   the bases of the at least two bipolar transistors which are connected to a same D.C. current source.

2. The transconductor of claim 1, wherein impedances of each of the individual connections of the emitters of the at least two bipolar transistors to the low voltage reference line are resistive connections.

3. The transconductor of claim 1, wherein the bases are connected to the D.C. current source by an isolating resistor.

4. The transconductor of claim 2, wherein ratios of isolating resistance of the isolating resistor to resistances of each of the individual connections of the emitters to the low voltage reference line are different.

5. The transconductor of claim 3, wherein the at least two bipolar transistors are of different sizes, and wherein the impedance of the individual resistive connection of each of the emitters to the low voltage reference line is implemented by a respective resistor.

6. The transconductor of claim 1, wherein the D.C. current source is formed by a connection, between a high voltage supply line and the low voltage reference line, of a second D.C. current source and of a first bipolar transistor of a given type, a junction of the second D.C. current source and of the first bipolar transistor being connected to a base of a second bipolar transistor of the same type as the first bipolar transistor, a collector/emitter terminal of which is connected to the high voltage supply line and an emitter/collector terminal of which is connected to a base of the first transistor and forms an output of the D.C. current source.

7. The transconductor of claim 6, wherein a resistor is interposed between the base of the first bipolar transistor and the emitter/collector terminal of the second bipolar transistor forming the output of the D.C. current source.

8. Input/output stage of a mixer or of a power amplifier or of a low-noise amplifier, formed of the transconductor according to claim 1.

9. A method of operating a transconductor comprising automatically selecting a non-linear class A operation or a linear class AB operation in response to a value of an input signal to be processed to generate an output signal and automatically adjusting current from a power supply to a level needed for operating the transconductor, wherein the transconductor comprises:
   at least two bipolar transistors, common bases of which define a first input/output terminal of the transconductor;
   interconnected collectors of the at least two bipolar transistors which define a second input/output terminal of the transconductor;
   emitters of the at least two bipolar transistors, each of the emitters is individually connected to a low voltage reference line by a respective impedance; and
   the bases of the at least two bipolar transistors which are connected to a same D.C. current source.

10. The method of claim 9 further comprising automatically selecting the non-linear class A operation if the value of the input signal is below a threshold and automatically selecting the linear class AB operation if the value of the input signal is above the threshold.

* * * * *